United States Patent [19]

Dayton et al.

[11] Patent Number: 4,525,836
[45] Date of Patent: Jun. 25, 1985

[54] CIRCUIT FOR CONVERTING A LOGICAL SIGNAL INTO TWO BALANCED LOGICAL SIGNALS

[75] Inventors: Birney D. Dayton, Nevada City; Dale L. Leavitt, Auburn, both of Calif.

[73] Assignee: The Grass Valley Group, Inc., Grass Valley, Calif.

[21] Appl. No.: 453,002

[22] Filed: Dec. 27, 1982

[51] Int. Cl.³ .......................... H04J 11/04; H04J 3/02; H04B 3/00
[52] U.S. Cl. ........................................ 370/67; 370/85; 375/36
[58] Field of Search ...................... 370/67, 85; 375/36; 179/15 W

[56] References Cited

U.S. PATENT DOCUMENTS

| | | | |
|---|---|---|---|
| 2,936,337 | 5/1960 | Lewis | 370/67 |
| 3,573,635 | 4/1971 | DaCosta | 375/36 |
| 4,037,049 | 7/1977 | Lyon | 375/36 |

*Primary Examiner*—Douglas W. Olms
*Assistant Examiner*—Frank M. Scutch, III
*Attorney, Agent, or Firm*—John Smith-Hill

[57] ABSTRACT

A circuit receives an input logical signal of one polarity and converts it into two balanced logical output signals of the opposite polarity. The circuit comprises two resistors connected between a reference potential source of the polarity of the output signals and the terminals at which the output signals are provided. The circuit also comprises a current source. Each resistor has a resistance value such that when it is traversed by the current from the current source the potential difference between its ends is equal to the difference between the two possible potential levels of the output signals. A differential switching device responds to the input signal being at a first potential level by connecting one of the output terminals to the current source and isolating the other output terminal from the current source, and vice versa when the input signal is at a second potential level.

13 Claims, 8 Drawing Figures

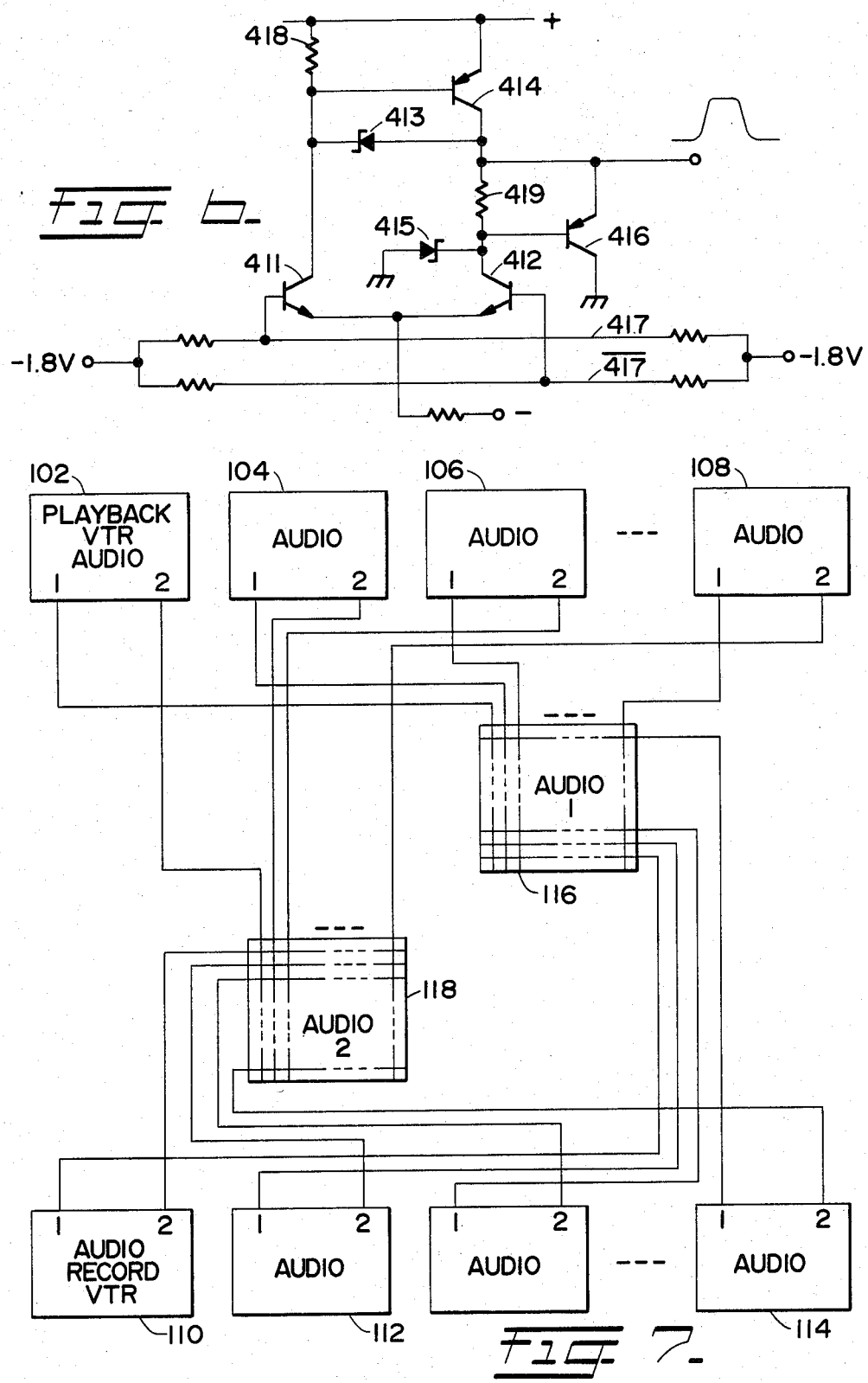

CIRCUIT FOR CONVERTING A LOGICAL SIGNAL INTO TWO BALANCED LOGICAL SIGNALS

This invention relates to a circuit for converting a logical signal into two balanced logical signals, and a device employing this circuit for selectively routing electrical signals from at least one of a plurality of sources to at least one of a plurality of destinations.

Two known digital logic system are the ECL system and the TTL sytem. The TTL system operates using a single signal-carrying conductor and with potential levels of 0.8 volts and 2.0 volts (0.8 volts represents logical zero and 2.0 volts represents logical one). In the ECL system complementary signals are carried on two conductors, and potential levels of −1.8 volts and −0.65 volts are employed. Logical zero is represented by −1.8 on one conductor (the "principal conductor") and −0.65 on the other conductor ( the "complementary conductor"), whereas logical on is reprsented by −0.65 volts on the prinicipal conductor and −1.8 volts on the complementary conductor. The ECL system is superior to the TTL system for transmission of signals over long distances, the ECL system has better noise immunity than the TTL system. On the other hand, many circuit components operating in the TTL system exhibit superior performance to equivalent components which operate in the ECL system. In addition, there are some fuctions that can be performed using circuit components which operate using TTL voltage levels but cannot be performed satisfactorily using components which operate using ECL voltage levels. For example, high speed analog-to-digital conversion can be effected using components which operate using TTL voltage levels but cannot be effected using readily available components which operate using ECL voltage levels.

Accordingly, a need exists for a device which is capable of rendering TTL circuit components compatible with an ECL transmission system.

For a better understanding of the invention, and to show how the same may be carried into effect, reference will now be made by way of example, to the accompanying drawings in which:

FIG. 3 illustrates in block form a portion of the audio routing switcher of FIG. 2;

FIG. 6 illustrates schematiclly one of the blocks of FIG. 4;

FIG. 7 illustrates in block form use of analog routing switchers with multiple dual channel source and destination devices.

Figure 1:
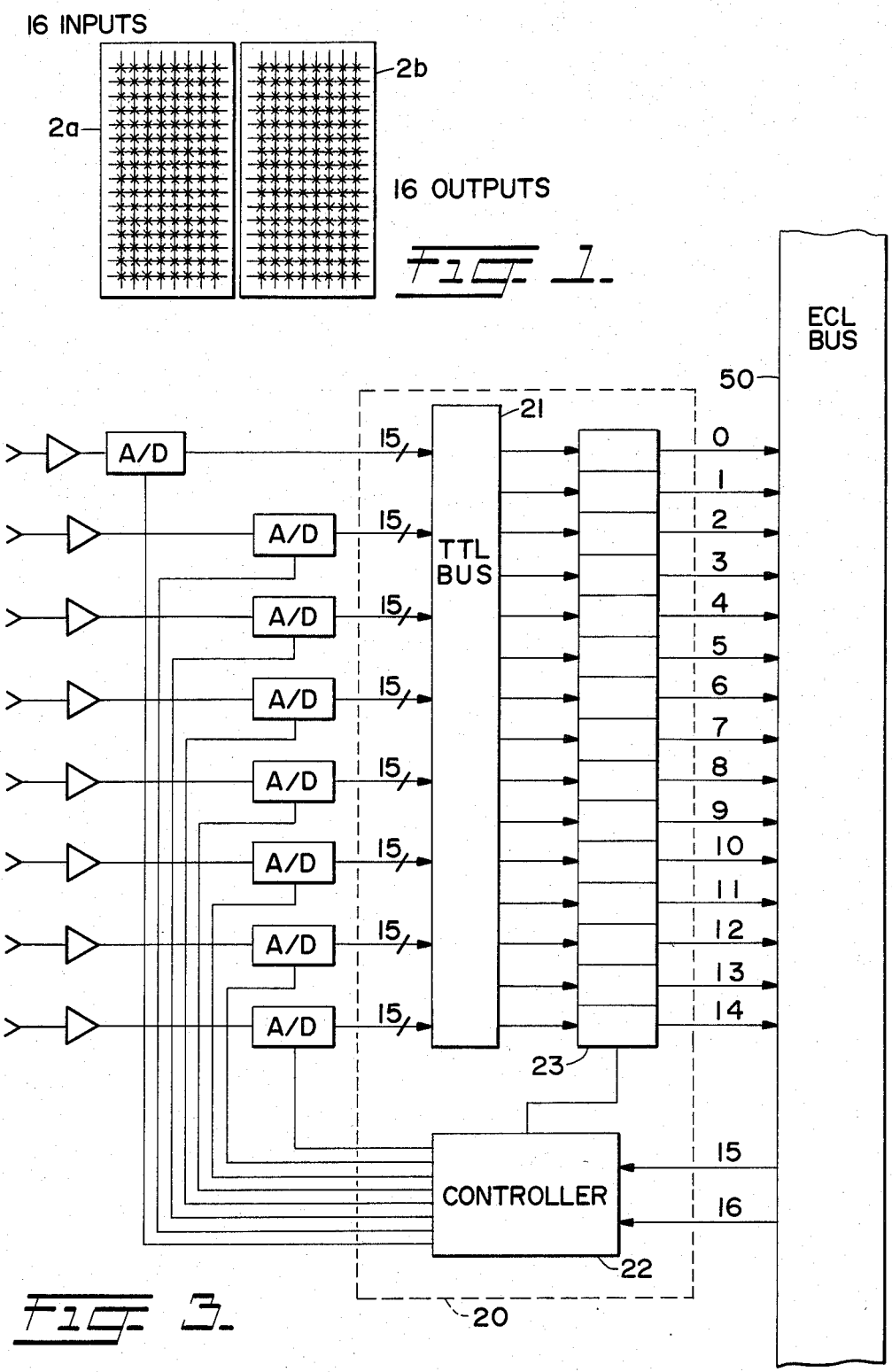
FIG. 1 illustrates diagrammatically a conventional analog audio routing switcher.

The routing switcher shown in FIG. 1 comprises two modules 2a and 2b. Each module is cpable of serving 8 inputs and 16 outputs and essentially comprises 8 input conductors and 16 output conductors. The input conductors can be regarded as being in crossing relationship with the output conductors, and at each crosspoint (of an input conductor and an output conductor) there is a switch element. The switch elements are selectively operable, so that each input conductor can be connected to each output conductor.

The routing switcher shown in FIG. 1 is a 16×16 switcher. It is capable of serving 16 inputs and 16 outputs, and has 256 crosspoints. An analog audio signal applied to one of the 16 input conductors can be routed to one or more of the output concuctors by closing the switch elements at appropriate crosspoints.

By adding more modules, the switcher shown in FIG. 1 can be expanded. For example, a 64×64 switcher can be constructed by adding 30 modules. The number of crosspoints, and hence the number of switch elements, is equal to the product of the number of input conductors and the number of output conductors. Thus, to exapand the 64×64 switcher to a 72×64 switcher it would be necessary to add four modules, having 512 (8×64) switch elements.

Figure 2:
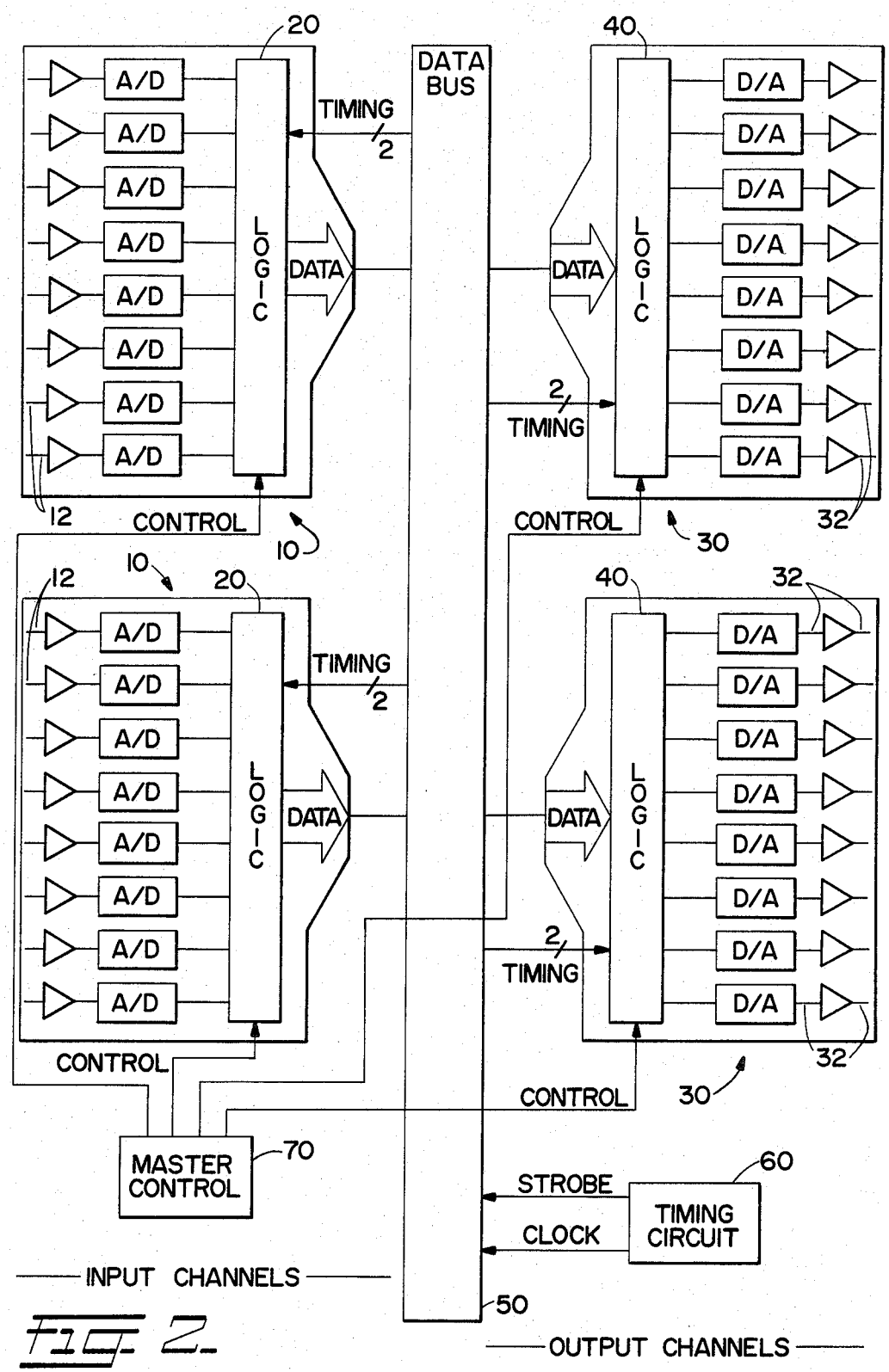
FIG. 2 illustrates diagrammaticlly a digital audio switcher.

The audio routing switcher shown in FIG. 2 operates using digital techniques and employs time division multiplexing. The switcher is manufactured in modular form and comprises two types of module, namely input modules 10a, 10b and output modules 30a, 30b. The input and output modules are connected to a bus 50. Each input module has eight input channels 12a ... 12h which, in use, are connected to eight analog signal sources respectively (not shown). Similarly, each output module has eight output channels 32a ... 32h which are connected to eight signal destinations respectively (not shown). The analog input signal from a selected signal source is converted, in the associated input channel, into a sequence of digital signals which are applied to the bus 50 through an interface 20. The interface 20 operates under control of a timing circuit 60 to apply the digital signals to the bus only during predetermined intervals. Each output module also includes an interface 40, controlled by the timing circuit 60, which is capable of sampling the bus during the same predetermined intervals and feeding the digital signals accepted from the bus to a selected output channel. The digital signals are converted in the selected output channel into a replication of the analog input signal, and this replication is fed to the selected signal destination.

The timing circuit 60 operates in known fashion to generate two pulse trains, namely a train of strobe pulses and a train of clock pulses. The train of strobe pulses has a period of 16 $\mu$s, and 256 clock pulses are generated in the transmission period between two consective strobe pulses. Accordingly, the clock pulses are gnerated at intervals of approximately 63 ns and have a frequency of approximately 16 MHz. The first clock pulse (pulse 0) of each sequence of 256 coincides with a strobe pulse.

The bus 50 has 17 lines. Fifteen lines ( lines 0 to 14) are used to transmit data, and the remaining lines (lines 15 and 16) are used for control. The strobe pulses are carried on line 15 and the clock pulses are carried on line 16.

Each input channel 12 of the digital audio routing switcher comprises an amplifier 14 and an A/D converter 16. Each A/D converter is capable of quantizing to 4096 levels, corresponding to 12 bits. In order to enhance the dynamic range capability of the input channel, the A/D converter generates an additional three companding bits according to an exponeutial (not linear) code, and so the A/D converter has a 15 bit output. Companding is a known technique for increasing the capability of an A/D converter. The 15 bits of each digital signal (corresponding to 1g levels of quantization) are applied in parallel to the interface circuit 40.

The bus 50 is contructed to operate in the ECL system. Therefore, each line of the bus has two conductors which carry balanced, negative voltage logic signals. The ECL is adopted for the bus 50 because of the well known advantages of the ECL system for transmission over relatively long distances (in the context of an audio routing switcher), including immunity from interference. However, the tri-state drivers (not shown), used to switch the outputs of the A/D converters, provide output signals at TTL voltage levels. Accordingly, the interface circuit includes, in addition to a 15- line TTL bus 21 and a controller 22, fifteen logic level conversion circuits 23 for converting the TTL signals on the lines of the bus 21 into ECL signals which can be carried on the bus 50.

The controller, which is connected to lines 15 and 16 of the bus 50 and thus receives the strobe and clock pulses, is activated only during the portion of the transmission period in which a group of eight clock pulses occur. For example, in the case of the first module 10a, the controller is activated from the time of occurrence of the strobe pulse until clock pulse 7 (the eighth clock pulse) occurs. In the case of the second module 10b the controller detects the strobe pulse, counts off clock pulses 0 to 7 and is then activated. The controller remains activated until clock pulse 15 occurs.

The eight successive clock pulses that are received while the controller 22 is activated are used to sample successively the eight A/D converters 16 of the input module during the eight 63 ns intervals following the respective clock pulses. Therefore, digital signals representative of the voltage levels of the analog signals from the eight sources are applied to the bus 21 during the eight intervals respectively. The fifteen bits of these digital signals are applied by the TTL bus 21 to the 15 logic level conversion circuits 23 respectively.

The controller also receives instructions from a master control 70, whereby the signal source and signal destination which are to be connected by the switcher are selected. If, for example, a signal is to be taken from the source connected to the second input channel 12b of the first input module 10a, the master control 70 instructs the controller 22 of the module 10a to examine its second input channel 12b by enabling the conversion circuits 23 during the interval between clock pulses 1 and 2. Similarly, if a signal is to be taken from the source connected to the third input channel of the second input module 10b, the controller of the second module enables the conversion circuits during the interval between clock pulses 11 and 12. It will therefore be seen that each input channel always addresses the same interval of the data transmission period. Since there are 256 intervals, the switcher is capable of expansion to serve up to 256 signal sources.

The logic level conversion circuits 23 convert the single-ended positive voltage signals on the TTL bus 21 into double-ended, balanced negative voltage signals. Of course, the logic level conversion circuits must be capable of switching rapidly on and off in order to ensure that the proper signals are applied to the ECL bus from the TTL buses of the respective input modules. Since the duration of each discrete interval of the transmission period 13 is only about 63 ns, the circuits 340 must be capable of switching at a frequency of about 16 MHz.

Figure 4:
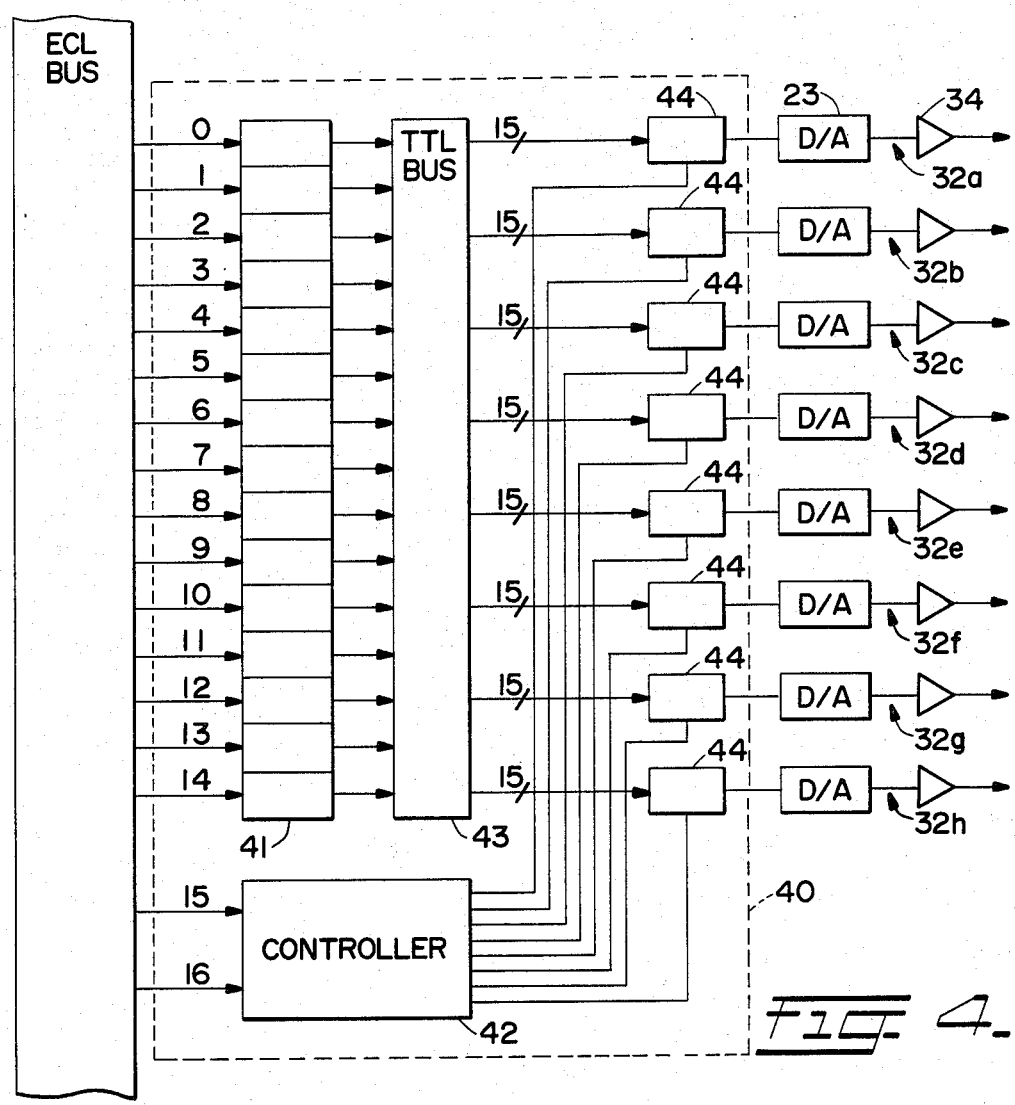
FIG. 4 illustrates in block form a second portion of the routing switcher of FIG. 2.

The logic level conversion circuit 23 shown in FIG. 4 comprises a controllable current source formed by a transistor 231, a referecne potential source formed by transistors 232 and 233, and two switching transistors 234 and 235. The reference potential source establishes two reference potentials, which are applied to the bases of the transistors 231 and 232 respectively. The base of the transistor 235 is connected to one line of the TTL bus 21. The collectors of the transistors 234 and 235 are connected through respective resistors 236 and 237 to a −1.8 volt potential source. The ends of the resistors 236 and 237 that are remote from the −1.8 volt source are connected to respective conductors 238 and $\overline{238}$ of one line of the ECL bus 50. The emitters of the transistors 234 and 235 are connected to the collector of the transistor 234, the emitter of which is connected through a switch device 239 selectively to ground and to a +5 volts potential level.

When the current source is enabled (the emitter of the transistor 231 is connected to +5 volts) and the base of the transistor 235 is at the upper TTL voltage level, i.e. +2 volts, the transistor 235 is non-conductive and the transisitor 234 is conductive. The conductor 238 is placed at -1.8 volts, and the current supplied by the transistor 231, dropped across the resistor 236, places the conductor 238 at -0.65 volts. Conversely, if the TTL line is at the lower TTL voltage level, i.e. +0.8 volts, the transistor 235 is conductive and the transistor 234 non-conductive, accordingly conductor 238 is at −1.8 volts and the conductor 238 is at -0.65 volts. When the current source is disabled (the emitter of the transistor 231 is connected to ground), the transistors 234 and 235 appear as open circuits to the conductors 238 and 238.

The switch device 239 is controlled by the controller 22 in dependence upon the clock pulses from the timing circuit 60. If, for example, signals are to be taken from the source connected to the third and fifth input channels 12c and 12f only of the first input module 10a, the controller 22, as well as sampling the A/D convertes of the channels 12c and 12f, activates the switch device 239 to connect the emitter of the transistor 231 to the +5 volts source during the third and fifth intervals of each transmission period, and to ground at all other times.

Figure 5:
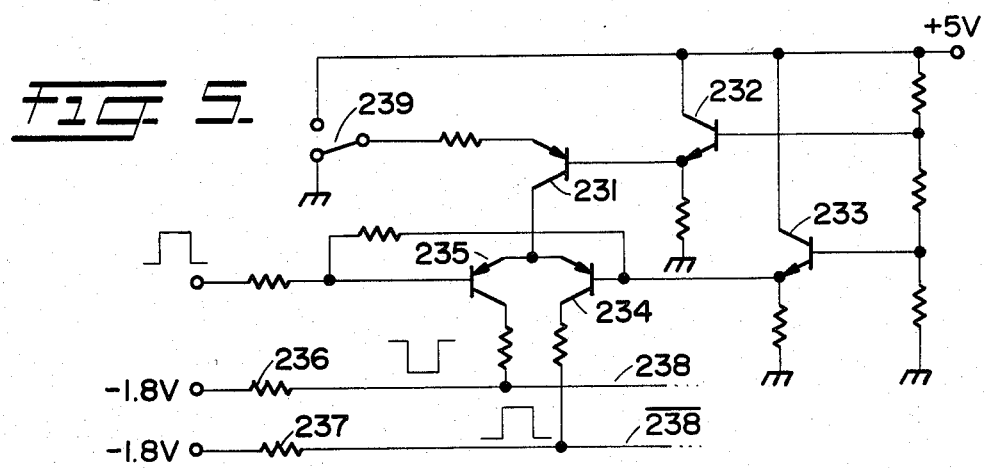
FIG. 5 illustrates schematically one of the blocks of FIG. 3.

It will appreciated from the foregoing description of FIG. 5 that the converter circuit 23 is a current driver, i.e. establishes the potential levels on the conductors 238 and 238 controlling current flow. In the conventional ECL bus driver, the output of the driver is taken from the emitter of a transistor, and accordingly the driver controls the potential levels directly instead of indirectly. The current driver of FIG. 5 has certain advantages over the conventional voltage driver. In particular, as suggested above, it is capable of rapid switching, without which it would not be possible to maintain fidelity of the data as it passes through the digital switcher.

The interface circuit 40 of each output module comprises fifteen ECL to TTL converter circuits 41. These circuits 41, which are controlled by a cotroller 42, are connected to respective lines of a 15-line TTL bus 43. The bus 43 is connected to eight latches 44 which are, in turn, connected to eight output channel 32. Each output channel comprises a D/A converter 33 and an amplifier 34.

The digital signals on the ECL bus 50 are converted to TTL voltage level by the circuits 41 and are appled to the TTL bus 43. The signals on the TTL bus 43 are sampled by selectively enabling the latches 44. For example, if it were desired that the signal from the source connected to the second input channel 12b of the first input module 10a be routed to the destination connected to the third output channel 32c of the second output module 30b, the master controller 70 would instruct the controller 42 of the second output module 30b to enable the latch 44c of the second module during the second interval of each data transimission period. The result is that the digital signal from the input channel 12b of the input module 10a, which was recreated on the TTL bus of the module 30b by the converter circuits 41, is written into the latch 44c during the second interval of each transmission period. These digital signals are converted to analog form by the D/A converter 33 of the channel 32c amplified and fed to the selected destination.

One of the ECL to TTL circuits 41 is shown schematically in FIG. 6. The circuit 41 comprises a pair of input transistors 411 and 412 having their bases connected to respective conductors of one line of the ECL bus 50 and having their emitters connected through a resistor to a negative potential source. The collector of the transistor 411 is connected through a 1K ohm resistor to a positive potential source, and is also connected to the cathode of a Schottky diode 413 and the base of a transistor 414. The collector of the transistor 412 is connected through another 1K resistor to the anode of the diode 413 and the collector of the transistor 414, and is also connected to the cathode of a Schottky diode 415 and to the base of a transistor 416. The collector of the transistor 416 is connected to ground and to the anode of the diode 415, and its emitter is connected to the anode of the diode 413. The output of the circuit 41 is taken from the emitter of the transistor 416.

When the conductor 417 ia at −1.8 volts and the conductor $\overline{417}$ is at −0.65 volts, the transistor 411 is off and the transistor 412 is on. The transistor 414 is held off, and the transistor 412 draws current through the resistor 419. The transistor 416 is therefoe conductive, and behaves as an emitter follower. The base of the transistor 416 is at a negative voltage, which is limited to a small value by the action of the diode 415, and emiter of the transistor 416 is just positive.

When the conductor $\overline{417}$ is at −0.65 volts and the conductor 417 is at −1.8 volts, the transistor 411 is on and the transistor 412 is off. The transistors 416. and 414 are on and off respectively. The voltage of the emitter of the transistor 416 is at a positive voltage, limited by the clamping action of the diode 413.

It will be appreciated that the illustrated circuit 41 exhibits very high speed operation. It is able to drive an MOS memory device, such as the latch 44, and consumed very little current when in either stable state: significant current is consumed only in the switching operation.

It will be understood by those skilled in the art that each line of the bus 50 must be terminated at eac end in its characteristic impedance in order to avoid reflection of digital signals from the ends of the line, which reflections would interfere with the signals properly on the bus. The resistors 236 and 237 of the circuits 23 serve this fuction at the input end of the bus. For this reason, the resistors 236 and 237 are placed at the end of the bus. The opposite ends of the conductors are also connected to the −1.8 volts potential level through respective resistors. In order to preserve balance of the lines, each terminating resistor must have a value equal to half the characteristic impedance of the line.

As compared with conventional analog audio routing switcher, the digital audio routing switcher shown in FIG. 3 has advantages. Notably, it is possible to increase, e.g., the number of sources served (up to a maximum of 256 in the case of the described switcher) without its being necessary to increase the nunber of operative components (crosspoints in the case of an analog switcher) by the product of the number of additional sources and the number of destinations served. Thus, the number of sources served by the digitl switcher can be increased smimply by increasing the number of input channels by the number of additional sources.

Figure 8:
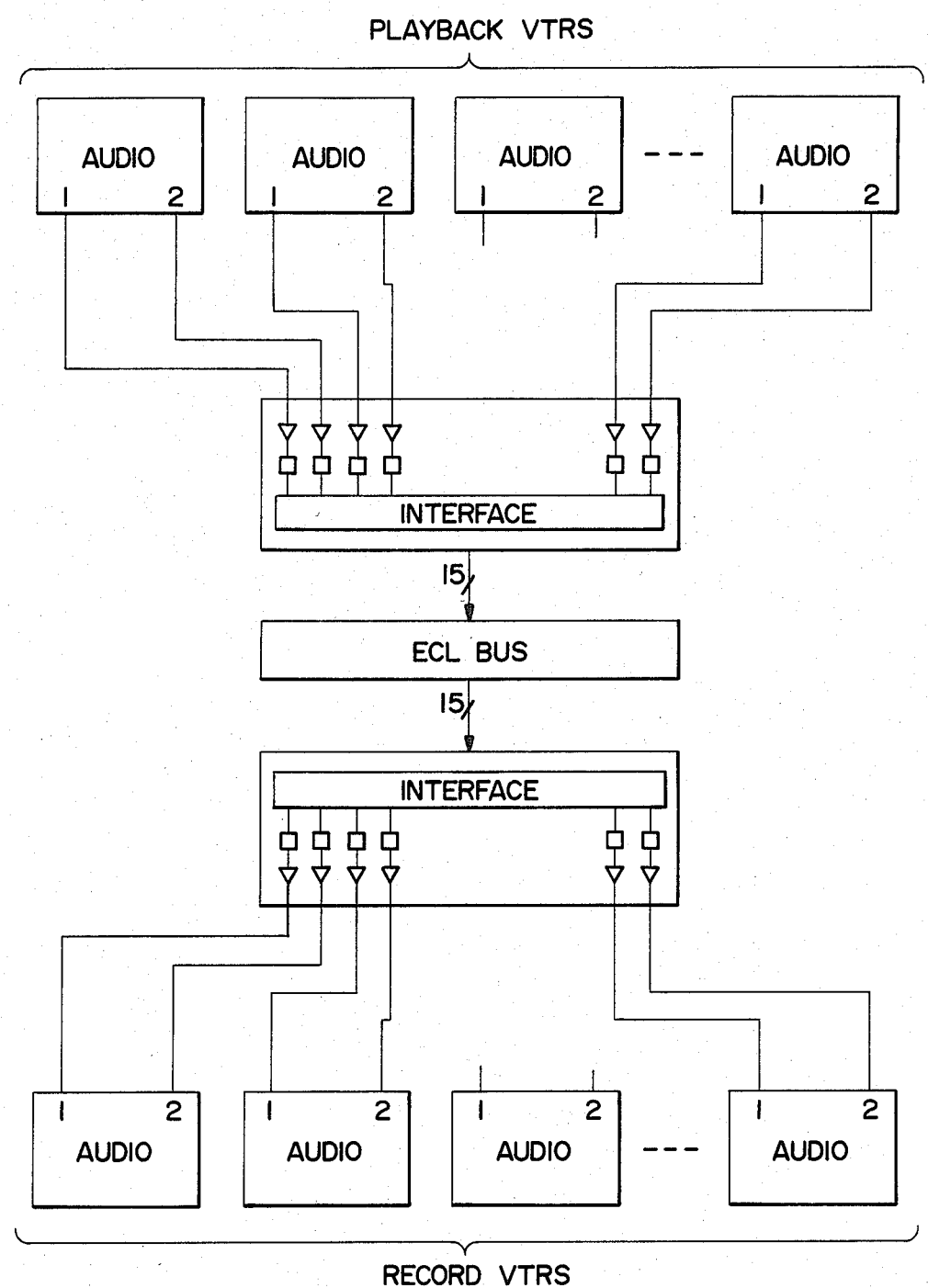
FIG. 8 illustrates in block form use of a digital routing switcher with multiple dual channel source and destination devices.

In addition, the digital switcher switcher is capable of routing a signal from any source to any destination. It is common parcitice in the broadcast industry to employ multiple channel signal originating devices and multiple channel signal receiving devices, such as multiple channel playback and record tape recorders (which term includes both video tape recorders which commonly have two audio channels and audio tape recorders which may have as many as 24 audio channels). In the case of a VTR, the two channel are conventionally left and right side sterophonic sound, different language versions of the same verbal information, background sound and voice-over commentary. There may be several playback VTRs feeding one or more record VTRs. In the conventional broadcast arrangement, respective analog crosspoint switchers are associated with each audio channel and with the video channel. For example, FIG. 7 shows a bank of N playback VTRs 102, 104, 106, 108, each having two audio channels and a bank of M record VTRs 110, 112, 114 each having two audio channels. Two conventional M×N crosspoint switchers 116 and 118 are associated with the two audio channels, and are capable of routing channel 1 of any playback VTR to channel 1 of any record VTR and of routing channel 2 of any playback VTR to channel 2 of any record VTR. However, the two channel of each VTR are essentially free of crosstalk, and therefore there is no technical reason why entirely unrelated information should not be recorded on the two channels respectively. However, if this were done it might be necessary to route channel 1 of a playback VTR to channel 2 of a record VTR, and this could be done, using the conventional crosspoint switcher, only by consolidating the two levels of switching (represented by the switcher 116 and 118) and employing a single switcher capable of routing each playback channel to each record channel. Clearly, this would require use of a 2M×2N switcher, having twice as many crosspoints as the two switchers 116 and 118 combined. However, a digital audio switcher having 2M+2N channels as shown in FIG. 8, has the same routing capability. (It will be noted that if the channels were maintained segregated, two digital switchers, each having M+N channels, would have the same routing capability as the two M×N switchers 116 and 118. Accordingly, the greater capability of the 2M×2N crosspoint switcher is obtainable using the digital switcher without need for any additional channels.)

It will be appreciated that the invention is not restricted to the particular circuits which have been shown and described, since variations may be made therein without departing from the scope of the invention as defined in the appended claims, and equivalents thereof. In particular, all numerical values are given by way of example only.

We claim:

1. A device for selectively routing analog electrical signals from at least one of a plurality of sources to at least one of a plurality of destinations, said device comprising:

analog-to-digital converter means for receiving an input analog signal from at least one selected source and converting the input analog signal into a corresponding sequence of digital signals at a frequency f, said analog-to-digital converter means having one output line for each digit of the digital signals produced thereby and each output line having a single conductor;

a data bus having one line for each digit of the digital signals produced by the analog-to-digital converter means, each line of the data bus having two conductors;

selectively-operable level converting and driving means for converting the digital signal on each output line of the analog-to-digital converter means into a pair of balanced digital signals and applying the resulting sequence of digital signals to the data bus, selectively-operable sampling means for accepting the sequence of digital signals from the the data bus;

digital-to-analog converter means for converting the sequence of digital signals into a replication of said input analog signal and applying said replication to at least one selected destination; and timing means for defining a succession of digital data transmission periods, of duration substantially equal to 1/f, and also defining n discrete intervals within each transmission period, where n is a positive integer greater than one, said timing means being operative to control the level converting and driving means so that the digital signals representative of said input analog signal are applied to the data bus during the $i^{th}$ interval of each of the successive transmission period (where i is a positive integer between one and n inclusive), and to control the sampling means so that it accepts digital signals from the data bus during the $i^{th}$ interval of each of the successive transmission periods.

2. A radio broadcast installation, comprising a plurality of sources of audio frequency analog electrical signals, a plurality of utilization destinations for such audio frequency analog electrical signals, and an audio routing switcher for selectively routing audio frequency analog electrical signals from at least one of said plurality of sources to at least one of said plurality of destinations, said switcher comprising analog-to-digital converter means for receiving an input analog signal from at least one selected source and converting the input analog signal into a corresponding sequence of digital signals at a frequency f;

a data bus;

selectively-operable driving means for applying the sequence of digital signals to the data bus, selectively-operable sampling means for accepting the sequence of digital signals from the data bus;

digital-to-analog converter means for converting the sequence of digital signals into a replication of said input analog signal and applying said replication to at least one selected destination; and timing means for defining a succession of digital data transmisission periods, of duration substantially equal 1/f, and also defining n discrete intervals within each transmission period, where n is a positive integer greater than one, said timing means being operative to control the driving means so that the digital signals representative of said input analog signal are applied to the data bus during the $i^{th}$ interval of each of the successive transmission periods (where i is a positive integer between one and n inclusive), and to control the sampling means so that it accepts digital signals from the data bus during the $i^{th}$ interval of each of the successive transmission periods.

3. An installation according to claim 2, wherein said analog-to-digital converter means have one output line for each digit of the digital signals produced thereby and each output line has a single conductor, the data bus has one line associated with each digit of the digital signals produced by the analog-to-digital converter means and each line of the data bus has two conductors, and the driving means include level converting means for converting the digital signal on each output line of the analog-to-digital converter means into a pair of balanced digital signals and applying the two digital signals of each pair to respective conductors of the associated line of the data bus.

4. An installation according to claim 3, wherein the analog-to-digital converter means comprise, associated with each source, an analog-to-digital converter circuit having a number of output lines equal to the number of digits of the digital signals produced by the analog-to-digital converter means, the output lines of each analog-to-ditital circuit each having one conductor, and an interface bus having one line for each digit of the digital signals produced by the analot-to-digital converter means, each line of the interface bus having one conductor and being connected to the conductor of the corresponding output line of each analot-to-digital converter circuit, and the timing means are connected to the analog-to-digital converter circuits to enable each converter circuit during a discrete time slot within each of the successive transmission periods.

5. An installation according to claim 4, wherein each analog-to-digital converter, when enabled, applied to each line of the interface bus a logical signal having one of first and second potential levels of one polarity, and the level converting and driving means comprise, associated with each line of the interface bus, a level converting and driving circuit for converting the logical signal applied to the associated line of the interface bus into first and second logical signals and applying the first and second logical signals, the first logical signal having one of two possible potential levels of the polarity opposite said one polarity and the second logical signal having the other of the two possible potential levels of said opposite polarity, the level converting and driving circuit having two output terminals connected to the two conductors respectively of an associated line of the data bus for applying the first and second logical signals to said two conductors respectively.

6. An installation according to claim 5, wherein each level converting and driving circuit comprises a current source, reference potential source means for providing a reference potential at the level of that possible potential level of said opposite polarity which has the greater absolute value, two resistors connected between the reference potential source means and the output terminals respectively and each having a resistance value such that when it is traversed by the current from the current source the potential difference between its ends is equal to the difference between the two possible potential levels of said opposite polarity, and a differential switching device responsive to the input terminal being at a first of said two potential levels of said one polarity to connect one of the two output terminals to the current source and isolate the other output terminal from the current source, and to the input terminal being at the second of said two potential levels of said one polarity to connect said other output terminal to the current source and isolate said one output terminal from the current source.

7. An installation according to claim 6, wherein said referecne potential source means provide, in use, a second reference potential at a level between the two potential levels of said one polarity, and said differential switching device comprises a pair of transistors having their collectors collected to the output terminals respectively and their emitters connected to the current source, the base of one of the transistors being connected to said input terminal and the base of the other transistor being connected to the reference potential source means to receive said second reference potential, so that when the input terminal is at the first potential level of said one polarity said one transistor is nonconductive and said other transistor is conductive, whereas when the input terminal is at the second potential level of said one polarity said one transistor is conductive and said other transistor is nonconductive.

8. An installation according to claim 6, wherein said current source includes a current supply terminal, for connection to a third potential level of said one polarity having a greater absolute value than either of said first and second potentials of said one polarity, a transistor having its collector connected to the differential switching device and having its base connected, in use, to a reference potential, and a switch for selectively connecting the emitter of the transistor to said current supply terminal or to ground, whereby said current source can be selectively enabled and disabled.

9. A device according to claim 1, wherein the analog-to-digital converter means comprise, associated with each source, an analog-to-digital converter circuit having a number of output lines equal to the number of digits of the digital signals produced by the analog-to-digital converter means, the output lines of each analog-to-digital circuit each having one conductor, and an interface bus having one line for each digit of the digital signals produced by the analog-to-digital converter means, each line of the interface bush having one conductor and being connected to the conductor of the corresponding output line of each analog-to-digital converter circuit, and the timing means are connected to the analog-to-digital converter circuits to enable each converter circuit during a discrete time slot within each of the successive transmission periods.

10. A device according to claim 9, wherein each analog-to-digital converter, when enabled, applied to each line of the interface bus a logical signal having one of first and second potential levels of one polarity, and the level converting and driving means comprise, associated with each line of the interface bus, a level converting and driving circuit for converting the logical signal applied to the associated line of the interface bus into first and second logical signals and applying the first and second logical signals, the first logical signal having one of two possible potential levels of the polarity opposite said one polarity and the second logical signal having the other of the two possible potential levels of said opposite polarity, the level converting and driving circuit having two output terminals connected to the two conductors respectively of an associated line of the data bus for applying the first and second logical signals to said two conductors respectively.

11. A device according to claim 10, wherein each level converting and driving circuit comprises a current source, reference potential source means for providing a reference potential at the level of that possible potential level of said opposite polarity which has the greater absolute value, two resistors connected between the reference potential source means and the output terminals respectively and each having a resistance value such that when it is traversed by the current from the current source the potential difference between its ends is equal to the difference between the two possible potentail levels of said opposite polarity, and a differential switching device responsive to the input terminal being at a first of said two potential levels of said one polarity to connect one of the two output terminals to the current source and isolate the other output terminal from the current source, and to the input terminal being at the second of said two potential levels of said one polarity to connect said other output terminal to the current source and isolate said one output terminal from the current source.

12. A device according to claim 11, wherein said reference potential source means provide, in use, a second reference potential at a level between the two potential levels of said one polarity, and said differential switching device comprises a pair of transistors having their collectors collected to the output terminals respectively and their emitters connected to the current source, the base of one of the tranisitors being connected to said input terminal and the base of the other transistor being connected to the reference potential source means to receive said second reference potential, so that when the input terminal is at the first potential level of said one polarity said one transistor is nonconductive and said other tranistor is conductive, whereas when the input terminal is at the second potential level of said one polarity said one transistor is conductive and said other transistors is nonconductive.

13. A device according to claim 11, wherein said current source includes a current supply terminal, for connection to a third potential level of said one polarity having a greater absolute value than either of said first and second potentials of said polarity, a transistor having its collector connected to the differential switching device and having its base connected, in use, to a reference potential, and a switch for selectively connecting the emitter of the transistor to said current supply terminal or to ground, whereby said current source can be selectively enabled and disabled.

* * * * *